US009157949B2

(12) United States Patent
Thiyagarajan

(10) Patent No.: US 9,157,949 B2
(45) Date of Patent: Oct. 13, 2015

(54) ACCELERATING THE AGING OF MULTIPLE LASERS

(71) Applicant: FINISAR CORPORATION, Sunnyvale, CA (US)

(72) Inventor: Sumesh Mani K. Thiyagarajan, Fremont, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 459 days.

(21) Appl. No.: 13/657,358

(22) Filed: Oct. 22, 2012

(65) Prior Publication Data

US 2013/0057313 A1 Mar. 7, 2013

Related U.S. Application Data

(62) Division of application No. 12/130,327, filed on May 30, 2008, now Pat. No. 8,294,484.

(60) Provisional application No. 60/941,215, filed on May 31, 2007.

(51) Int. Cl.
*G01R 31/26* (2014.01)
*H02S 50/10* (2014.01)

(52) U.S. Cl.
CPC .......... *G01R 31/2635* (2013.01); *H02S 50/10* (2014.12)

(58) Field of Classification Search
CPC .......... G01R 31/2635; G01R 31/2642; G01R 31/2632; G01R 31/26; G09G 2320/043; H02S 50/10; H05B 6/062; H01S 3/0014; H01S 3/0604; H01S 3/23; H01S 5/0287; H01S 5/0288; H01S 5/0683; G02B 5/285; G02B 6/264; G02B 6/3588; G02B 6/4204; G02B 6/4292; A61M 25/0045
See application file for complete search history.

(56) References Cited

U.S. PATENT DOCUMENTS

| 5,381,103 A * | 1/1995 | Edmond et al. .......... 324/754.06 |
| 5,631,571 A * | 5/1997 | Spaziani et al. ......... 324/754.03 |
| 2003/0204820 A1* | 10/2003 | Asano et al. ..................... 716/1 |

* cited by examiner

*Primary Examiner* — Vinh Nguyen
(74) *Attorney, Agent, or Firm* — Maschoff Brennan

(57) ABSTRACT

A method of accelerating the aging of a laser to thereby determine the reliability of the laser. The method includes an act of providing a laser die for reliability testing, an act of applying a plurality of short signal pulses to the laser die so as to simulate the aging of the laser die, and an act of ascertaining the reliability of the laser die based on its response to the plurality of short signal pulses.

16 Claims, 6 Drawing Sheets

ACCELERATING THE AGING OF MULTIPLE LASERS

CROSS-REFERENCE TO RELATED APPLICATIONS

This application is a Divisional of U.S. patent application Ser. No. 12/130,327, filed May 30, 2008, now U.S. Pat. No. 8,294,484, titled PULSE VOLTAGE AGE ACCELERATION OF A LASER FOR DETERMINING RELIABILITY, which claims the benefit of U.S. Provisional Application No. 60/941,215, filed May 31, 2007, both of which are incorporated herein by reference in their entireties.

BACKGROUND

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A grating is included in either the top or bottom layer to assist in producing a coherent light beam in the active region. The coherent stream of light that is produced in the active region can be emitted through either longitudinal end, or facet, of the laser body. DFB lasers are typically known as single mode devices as they produce light signals at one of several distinct wavelengths, such as 1,310 nm or 1,550 nm. Such light signals are appropriate for use in transmitting information over great distances via an optical communications network.

BRIEF SUMMARY

One example disclosed herein relates to a method of accelerating the aging of a laser to thereby determine the reliability of the laser. The method includes an act of providing a laser die for reliability testing, an act of applying a plurality of short signal pulses to the laser die so as to simulate the aging of the laser die, and an act of ascertaining the reliability of the laser die based on its response to the plurality of short signal pulses.

Another example disclosed herein relates to a method of accelerating the aging of multiple lasers to thereby determine the reliability of the lasers. The method includes an act of providing a first plurality of lasers for reliability testing, wherein the first plurality of lasers include a first facet coating, an act of applying a plurality of short signal pulses to the first plurality of lasers so as to simulate the aging of the first plurality of lasers, an act of ascertaining the reliability of the first plurality of lasers based on their response to the plurality of short signal pulses, an act of providing a second plurality of lasers for reliability testing, wherein the second plurality of lasers include a second facet coating that is different from the first facet coating, an act of applying a plurality of short signal pulses to the second plurality of lasers so as to simulate the aging of the second plurality of lasers, and an act of ascertaining the reliability of the second plurality of lasers based on their response to the plurality of short signal pulses.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

Example Operating Environment

Figure 1:
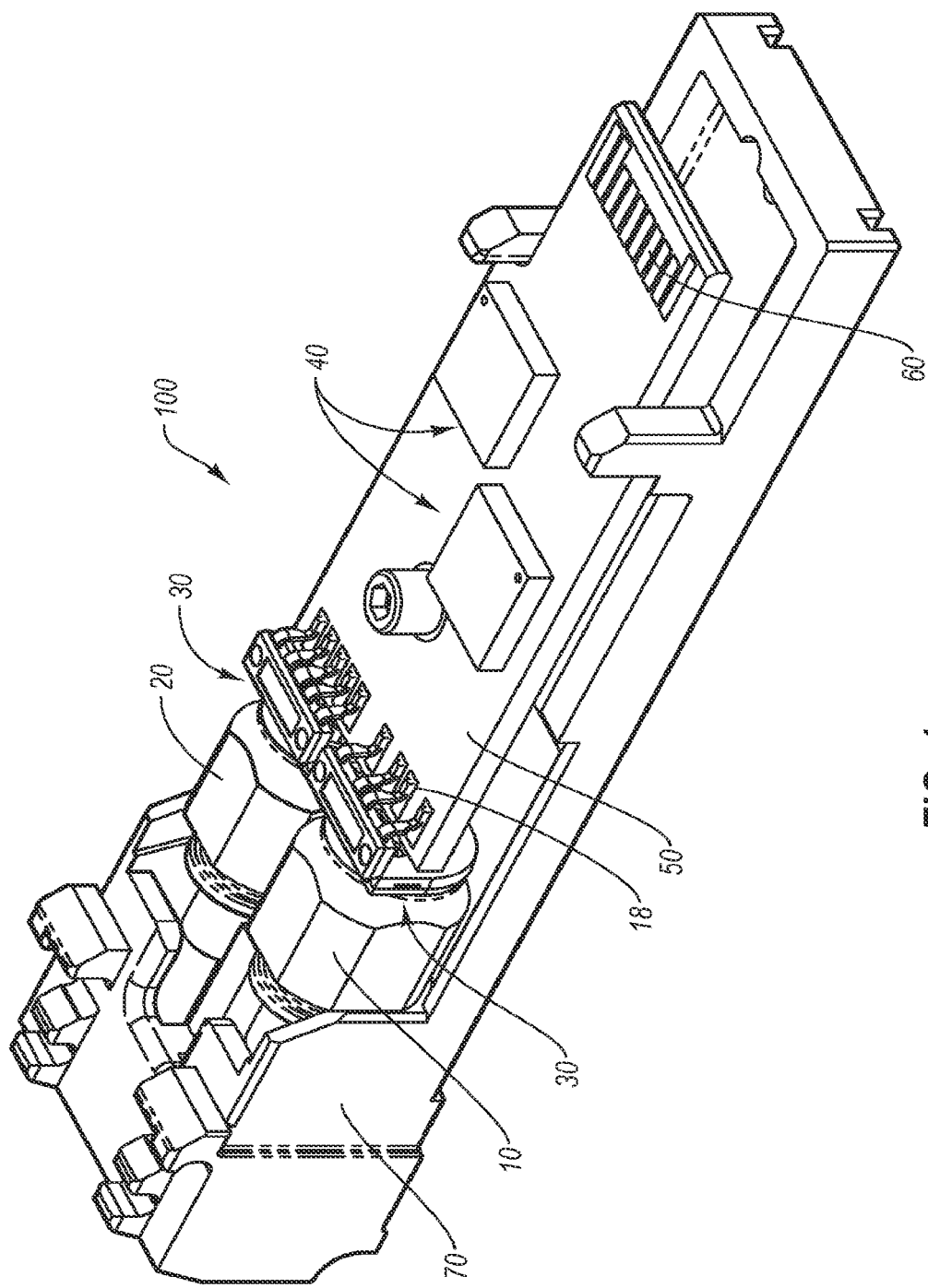
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer. Having described a specific environment with respect to FIG. 1, it will be understood that this specific environment is only one of countless architectures in which the principles of the present invention may be employed. As previously stated, the principles of the present invention are not intended to be limited to any particular environment.

Example Distributed Feedback Laser

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way. In particular, the principles of the present invention may also be achieved in a 1310 nm 2.5 G DFB laser.

a. Base Epitaxial Layers

Figure 2:
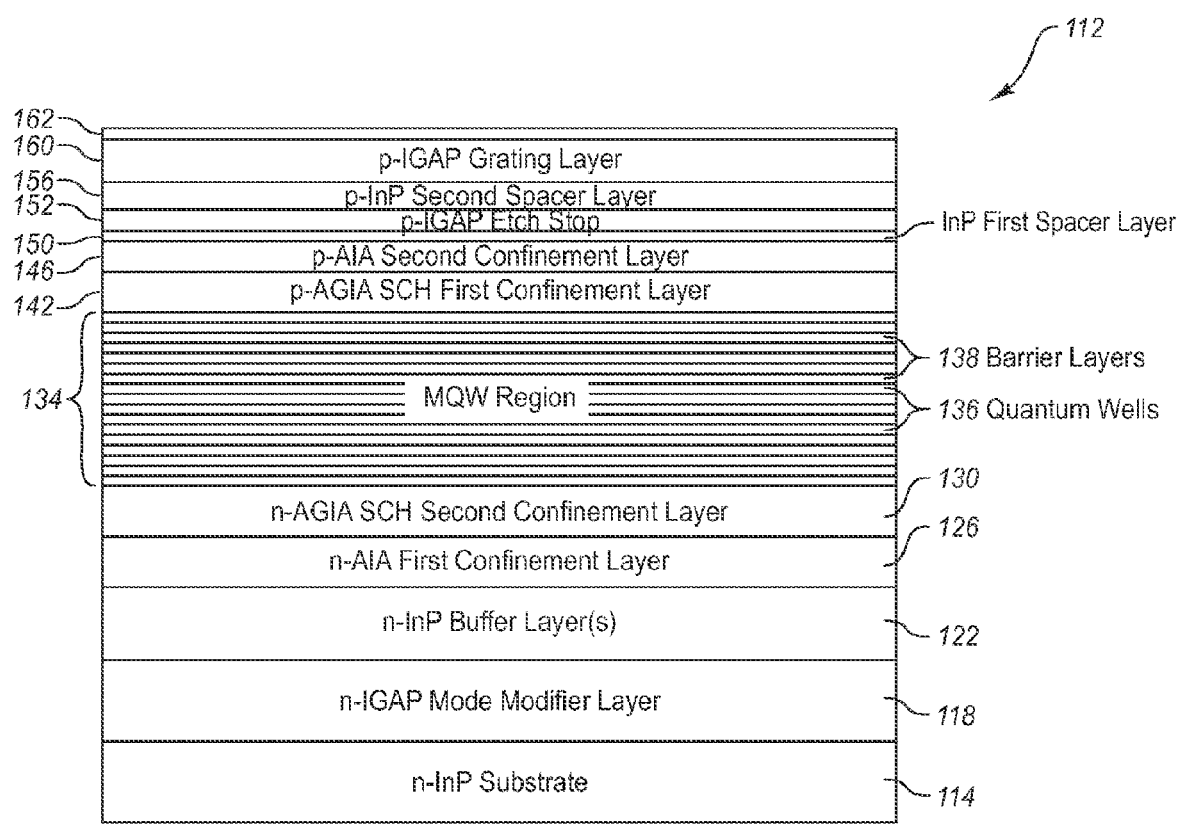
FIG. 2 is a cross sectional side view of an epitaxial base portion of a distributed feedback ("DFB") laser, according to one embodiment of the present invention.

FIG. 2 illustrates the base epitaxial layers of an example 10 G DFB laser, generally designated at 110, at a stage prior to etching of the grating layers. The DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 μm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. In this example, the active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than typical multi-quantum-well designs. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. In the illustrated embodiment, quantum well design may be manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes. Further details regarding the doping of the MQW region 134 will be given further below.

A first p-confinement layer 142 of Aluminum Gallium Indium Arsenide (p-AGIA SCH) is grown on the active region at a predetermined thickness and is doped with zinc. A second p-confinement layer 146 of Aluminum Indium Arsenide (p-AIA) is grown at a predetermined thickness, on the p-AGIA SCH layer and is also doped with zinc. Both of the p-layers are confinement layers and effectively maintain holes within the active region so that photons are produced. The p-AGIA SCH layer 142 is graded to improve the confinement characteristics of the layer.

A spacer layer 150 is located above the p-confinement layers. This spacer layer is made of Indium Phosphide. Various "above-active" grating layers are located above the spacer layer. An etch stop layer (p-IGAP etch stop) 152 made of Indium Gallium Arsenide Phosphide is grown on the spacer layer 150. This etch stop layer is provided for stopping the mesa etch during the regrowth process.

A second spacer layer 156 is provided to separate the etch stop layer 152 and the grating layer. In the illustrated design, the grating etch step is timed to stop within this spacer layer. The layer is made of Indium Phosphide (p-InP).

A grating layer (p-IGAP) 160 is grown on the second spacer layer 156 and is made of Indium Gallium Arsenide Phosphide. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the example DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed.

b. Grating Fabrication and Regrowth

Figure 3:
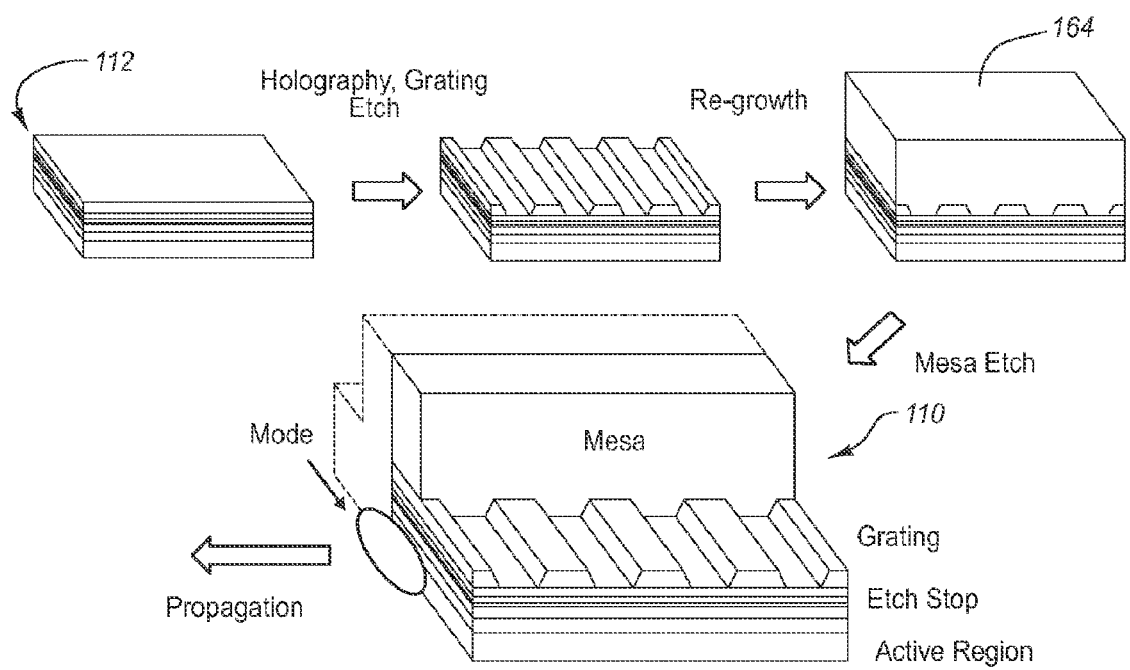
FIG. 3 is a progressive view of various processing and manufacture stages performed on the epitaxial base portion shown in FIG. 2.

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth steps in forming the DFB laser 110. As described above and by way of brief overview, a wet etch is performed to etch periodic gaps within the grating layer, as shown in FIG. 3. After the etch is completed and the grating teeth are created, thick Indium Phosphide is grown ("regrowth") on the etched, base epitaxial structure, in order to fill the gaps with low-index InP and also to form the mesa layer, also shown in FIG. 3. The regrowth is completed with an Indium Gallium Arsenide layer for electrical contact.

As mentioned above, the Indium Phosphide regrowth is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth, thereby defining the mesa of the DFB laser. Both dry and wet etching can be used in creating the mesa ridges.

After the etching process is complete, a dielectric layer (not explicitly shown) is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa. In other embodiments, a single layer of Silicon Nitride or Silicon Oxide can be employed for the dielectric layer.

The dielectric layer is removed from the top of the mesa to allow an electrical contact and metallic layer (not shown) to be placed on the mesa. Electrical contact is made by depositing metal onto the Indium Gallium Arsenide layer at the top of the mesa. This contact is both a non-alloy contact and a low penetration contact.

A metallic layer (not shown) is placed on the electrical contact to which electrical current may be provided to the laser structure. In the present embodiment, the metallic layer is made of three sub-layers of titanium, platinum and gold. The titanium sun-layer is placed directly on the electrical contact layer, then the platinum sub-layer and gold sub-layer are applied. This metallic layer provides sufficient conductivity to the Indium Gallium Arsenide layer so that current can be properly provided to the laser structure.

Bottom electrical contacts are generated by thinning the InP substrate and placing an n-type metallic layer (not shown) on the bottom.

A DFB laser is removed from a wafer using common techniques by cleaving and breaking the wafer both horizontally and laterally to separate each laser. After this process, anti-reflective ("AR") and high-reflective ("HR") coating processes are performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which optically couples with an optical fiber. A minority of the optical power is emitted from the back of the laser, which may couple with a photodetector (not shown) that is used to monitor laser performance.

In one embodiment, the AR and HR coatings are made of layers of Silicon Oxide and Silicon. The reflectivity of the AR coating is designed to be less than about 0.5%, while the HR coating is designed to be higher than approximately 90%. Once the coating process is complete, a testing process is performed in which the power characteristics and optical spectrum are tested.

The DFB laser 110 and photodetector are packaged into an optical subassembly, such as the TOSA 20 shown in FIG. 1, which is subsequently packaged into an optical module, e.g., the transceiver 100 of FIG. 1, along with driver and control integrated circuits.

Although the above description was specifically tailored to a DFB laser, the examples disclosed herein may also be used in other high-speed lasers, such as a 1310 nm 10 G Fabry-Perot (FP) laser. The Fabry Perot laser, as is known in the art, is also grown on a substrate with various layers, a mesa and an active.

c. Burn-In of a RWG Laser

Typically, every wafer that is fabricated generates a number of functionally good laser die. In one example, a launched wafer may provide 2000 good laser die. Not all of these 2000 laser die, however, are robust enough to withstand aging in a user's hands. A harsh stress condition called burn-in, which is a combination of temperature, current and power, is generally used to weed-out the weak sub-population of laser die. After weeding out the weak sub-population, the rest of the parts can be shipped to an end user. Unfortunately, however, there are at least two challenges associated with identifying a suitable burn-in condition, particularly for aluminum ridge waveguide lasers.

One challenge is that with a continuous wave (CW) stress condition, finding an optimal combination of stress conditions (temperature, current, power) may be impossible. Generally a RWG laser or other type of laser can only safely operate well below a critical optical intensity level called Catastrophic Optical Damage (COD) threshold intensity. When a laser is operated at or above this intensity level, the laser dies catastrophically. The COD intensity level is determined by the material composition of the laser, by the material composition of any facet coating material that has been applied to the laser, and the effective cross-sectional area of the output beam of the laser. It is also well known that the COD level decreases with age of the laser and the aging conditions (eg: power) under which the laser has been aged.

Figure 7:
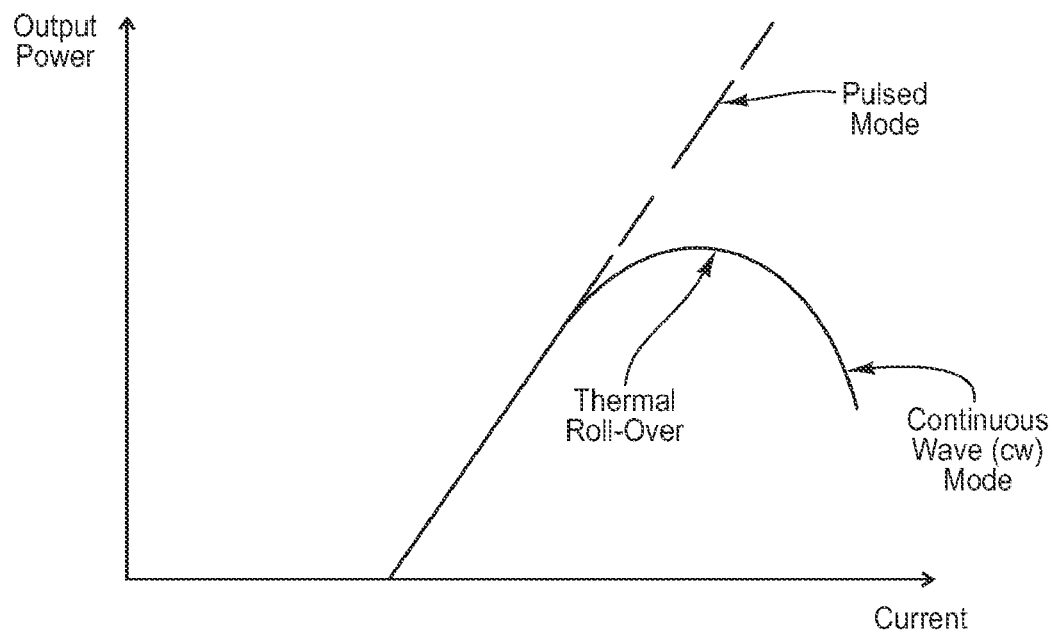
FIG. 7 illustrates output power versus thermal roll-over in accordance with embodiments disclosed herein.
Figure 8:
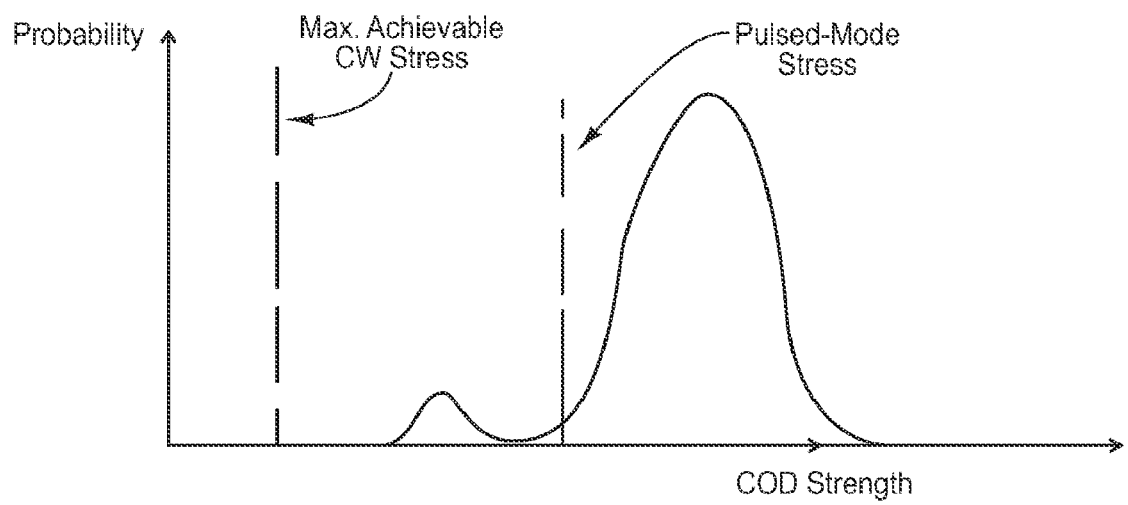
FIG. 8 illustrates output power and optical intensity versus COD level in accordance with embodiments disclosed herein.

The weaker population of lasers mentioned above typically tend to have lower COD levels. Under CW operating conditions, the maximum output power is limited by thermal roll-over as seen in FIG. 7. This maximum output power and optical intensity may be less than the COD level and hence will hinder a manufacturer's ability to screen out the weak devices as seen in FIG. 8. Under a pulsed-mode operation the laser can reach high optical intensity since it does not experience thermal roll-over. Thus, the weaker population of laser die, which have a lower COD level, will die during this pulsed-mode stress and hence, can be weeded out, as also seen FIG. 8.

The second challenge is that under CW mode the duration needed to weed the weaker population, even if it were feasible, would be long. This leads to significant up-front capital investment and hence is not desirable. On the contrary, with pulsed mode, a higher stress condition can be explored leading to a very short and desirable burn-in.

d. Reliability Testing of a Laser

Typically, reliability of a laser is checked by applying current for a specified time, for example at a time scale of 500-1,000 hours. The performance of the laser may then be checked. In addition, the laser may be placed in an oven at 100 degrees Celsius for the specified time while the current is applied the laser.

In some tests, a large group of lasers are subjected to reliability testing at the same time. For example, in one embodiment, a first group of 100 lasers with a first type of facet coating may have a current applied to them for a specified time and/or may be placed in an oven to age them. In like manner, a second grouping of 100 lasers with a second facet coating may be tested for reliability.

One of the challenges with reliability, particularly for aluminum ridge waveguide lasers, is that this process takes a long time to figure out what the laser's reliability is. It generally costs a lot of money in upfront investment and a lot of parts for a long time duration as typically the lasers have to age by using different ovens and operating under different conditions.

Figure 4:
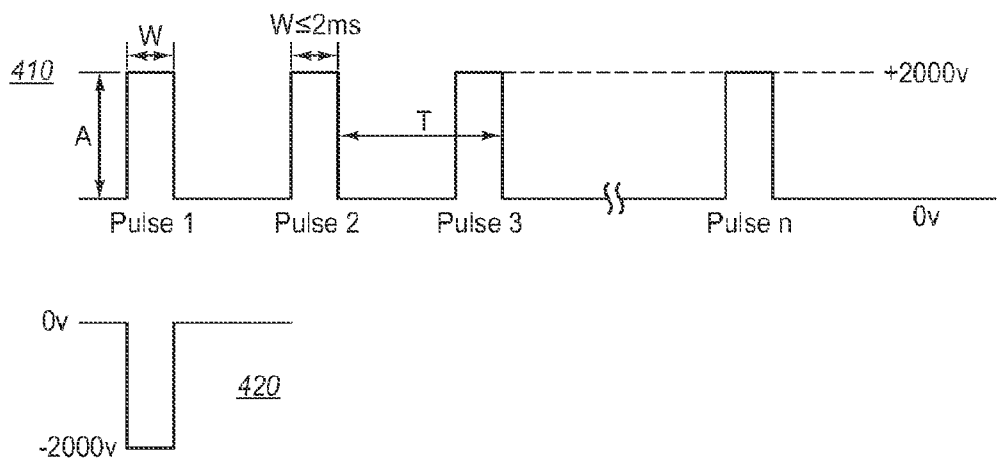
FIG. 4 illustrates a short signal pulses being applied to a laser in accordance with embodiments disclosed herein.

Advantageously, the principles of the present invention allow for a testing method that is configured to test the reliability of a laser in a very short period of time. For example, as is illustrated in FIG. 4, a series of short pulses 410 and/or 420 may be applied in short succession to a laser 400 such as the laser 110 described in relation to FIGS. 1-3. Of course, the principles of the present invention are not limited to DFB lasers and may be applied to other types of lasers such as VCSELS, FP and other types of lasers known in the art. The series of short pulses 410 and 420 have the effect of rapidly aging the laser under test. The laser's reliability may then quickly be ascertained. In addition, the series of short pulses aids in determining the weaker subset of laser die discussed previously and thus helps a manufacturer to subsequently weed-out theses lasers from the more robust subset of laser die.

For example, as illustrated in FIG. 4, pulse 410 may have an amplitude A, a width W, and a period T. In some embodiments, the width of the pulse may be less than or equal to about 2 milliseconds, although other widths may also be used as circumstances warrant. Likewise pulse 420 may also have an amplitude A, a width W, and a period T.

In one embodiment, the amplitude and width of pulse 410 and/or pulse 420 may be the same. In another embodiment, the amplitude of pulse 410 and/or pulse 420 may be varied while the width is fixed or kept constant. In still other embodiments, the width of pulse 410 and/or pulse 420 may be varied while the amplitude is fixed or kept constant. In yet further embodiments, the amplitude and width of pulse 410 and/or pulse 420 may both be varied.

In one embodiment, pulse 410 may be a 2000 volt pulse while pulse 420 may be a −2000 volt pulse. It should be noted that FIG. 4 shows that any number of pulses may be used as necessary and thus the embodiments disclosed herein are not limited by any number of pulses. The amount of current that finally causes the laser under test to fail may then be ascertained.

Typically, as current is injected into a laser, the laser heats up and the output optical power may not correspond to the amount of input current due to this heat. Use of the short pulses, however, typically allows a larger amount of current to be injected into the laser under test and a larger amount of optical power to be output without the loss due to the heat, which in turn advantageously allows for greater reliability testing.

In one embodiment, the series of pulses 410 and/or 420 may first be applied to a first set of lasers, such as a group of 100 lasers, with a first facet coating. The current levels and optical output levels at which the laser begin to fail may then be ascertained. This process may be continued until all the lasers have failed. Accordingly, a range of operating currents at which the lasers fail may be determined.

In similar fashion, a second set of lasers, such as a group of 100 lasers, with a second facet coating may be have pulses 410 and/or 420 applied to them. The current levels and the optical output levels at which these lasers begin to fail may also be ascertained and the range of currents may be determined. Further, the two types of facet coatings may be compared to determine which facet coating caused their respective plurality of lasers to be operate for a longer period of time.

Figure 9:
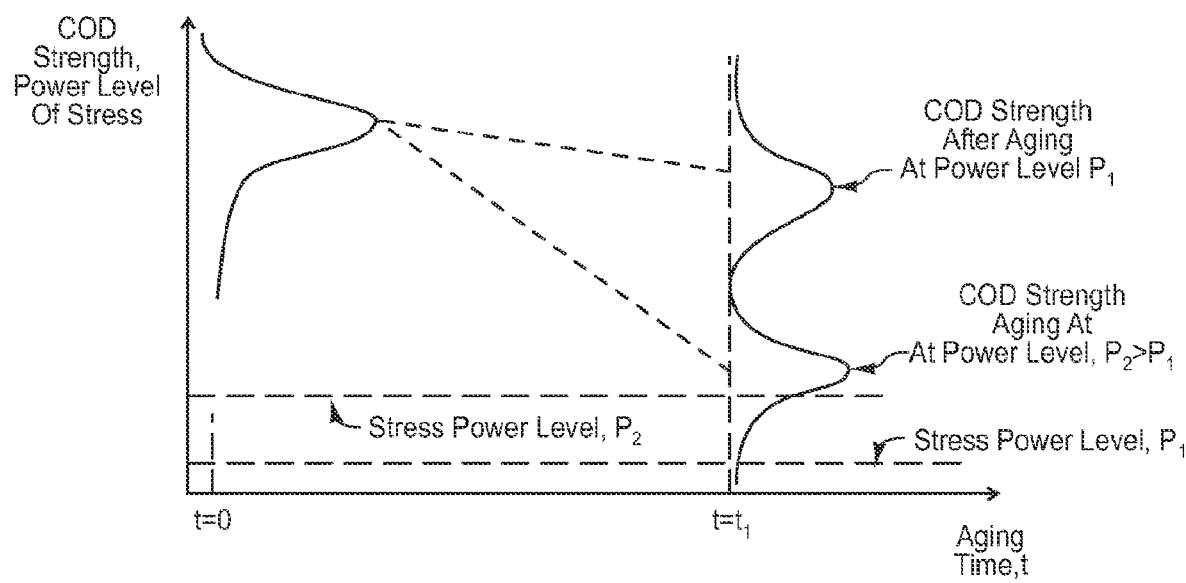
FIG. 9 illustrates COD level versus aging in accordance with embodiments disclosed herein.

Advantageously, the use of short pulses 410 and/or 420 also allow for a quick test of the COD level of a laser or group of lasers under test. As explained above, the use of the pulses allows for an increasing amount of current to be injected into the laser and a greater optical intensity to be output. The point at which the laser reaches or exceeds the COD level and fails may then be ascertained quickly, efficiently, and with lower cost as may be seen in FIG. 9.

Figure 5:
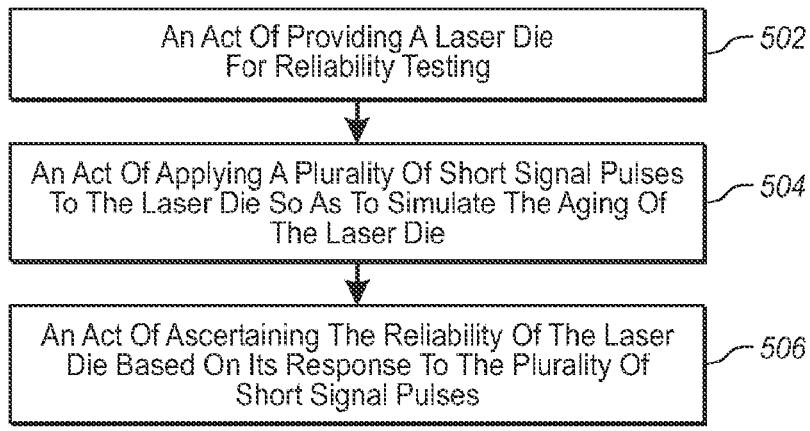
FIG. 5 illustrates a flowchart of a method for accelerating the aging of a laser to thereby determine the reliability of the laser in accordance with embodiments disclosed herein.

Referring now to FIG. 5, a flowchart of a method 500 for accelerating the aging of a laser to thereby determine the reliability of the laser is illustrated. Method 500 includes an act of providing a laser die for reliability testing (act 502). For example, a laser such as laser 110 of FIG. 2, or any other suitable laser, may be provided for reliability testing.

Method 500 also includes an act of applying a plurality of short signal pulses to the laser die so as to simulate the aging of the laser die (act 504). For example, as described previously, a number of short signal pulses, such as positive and negative 2000 volt signals, may be applied to the laser provided for in act 502.

Method 500 further includes an act of ascertaining the reliability of the laser die based on its response to the plurality of short signal pulses (act 506). For example, as described previously, the short pulses rapidly age the laser under test. The laser's reliability may then quickly be ascertained. In other words, operational information about the laser may be ascertained quickly. Advantageously, this removes the need for the typical long, expensive process of aging the laser by putting it in an oven to test its reliability. Instead, the amount of current that causes a laser to fail over time and its COD may be quickly ascertained.

Figure 6:
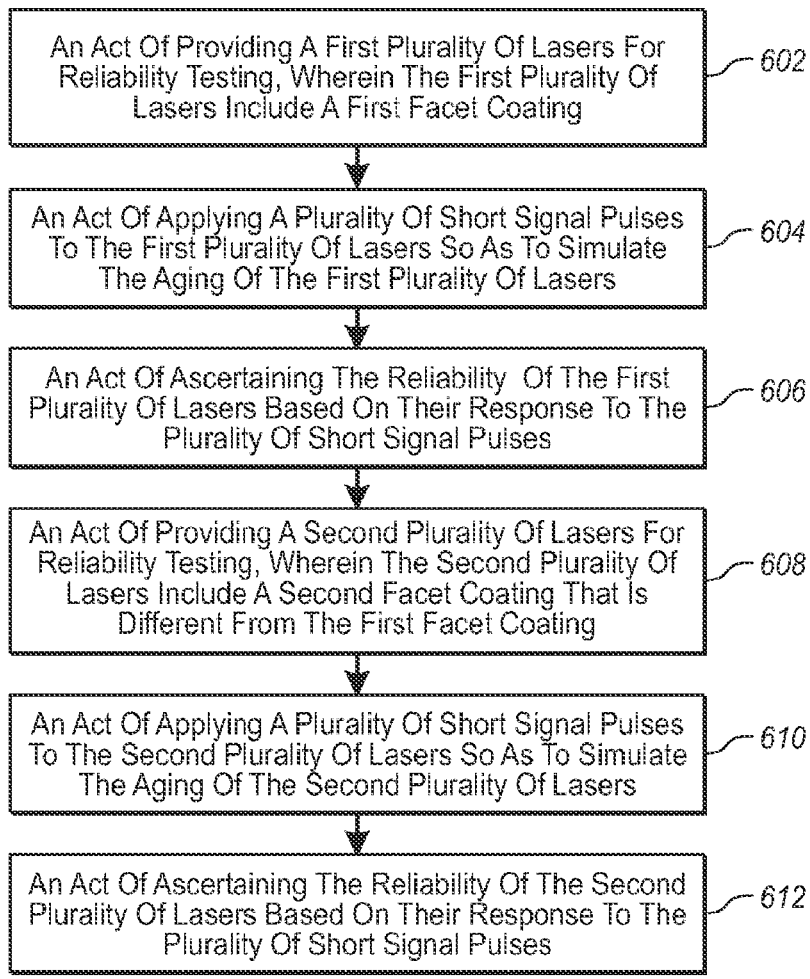
FIG. 6 illustrates a flowchart of a method for accelerating the aging of multiple lasers to thereby determine the reliability of the lasers in accordance with embodiments disclosed herein.

Referring now to FIG. 6, a flowchart of a method 600 for accelerating the aging of multiple lasers to thereby determine the reliability of the lasers is illustrated. Method 600 includes an act of providing a first plurality of lasers for reliability testing, wherein the first plurality of lasers include a first facet coating (act 602), an act of applying a plurality of short signal pulses to the first plurality of lasers so as to simulate the aging of the first plurality of lasers (act 604) and an act of ascertaining the reliability of the first plurality of lasers based on their response to the plurality of short signal pulses (act 606). For example, a short series of pulses may be applied to a first set of lasers such as laser 110 or some other suitable laser that include a first facet coating to simulate the aging of the lasers. The reliability of the first set of lasers may then be determined as previously described.

Method 600 also includes an act of providing a second plurality of lasers for reliability testing, wherein the second plurality of lasers include a second facet coating that is different from the first facet coating (act 608), an act of applying a plurality of short signal pulses to the second plurality of lasers so as to simulate the aging of the second plurality of lasers (act 610), and an act of ascertaining the reliability of the second plurality of lasers based on their response to the plurality of short signal pulses (act 612). For example, a short series of pulses may be applied to a second set of lasers such as laser 110 or some other suitable laser that includes a second facet coating that is different from the first facet coating to simulate the aging of these lasers. The reliability of the second set of lasers may then be determined as previously described. In some embodiments, the two types of facet coatings may be compared to determine which facet coating caused their respective plurality of lasers to be operated for a longer period of time.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of accelerating the aging of multiple lasers to thereby determine the failure of the lasers, the method comprising:
    providing a current source configured for supplying current in a plurality of short signal pulses;
    providing a first plurality of laser structures for reliability testing, wherein the first plurality of laser structures include a first facet coating;
    applying current from the current source to the first plurality of laser structures such that the first plurality of laser structures emit output light beams having an output power and optical intensity, the current being applied to the first plurality of laser structures in a plurality of short signal pulses so as to simulate the aging of the first plurality of laser structures;
    ascertaining failure of the first plurality of laser structures based on their response to the plurality of short signal pulses;
    providing a second plurality of laser structures for reliability testing, wherein the second plurality of laser structures include a second facet coating that is different from the first facet coating;
    applying current from the current source to the second plurality of laser structures such that the second plurality of laser structures emit output light beams having an output power and optical intensity, the current being applied to the second plurality of laser structures in a plurality of short signal pulses so as to simulate the aging of the second plurality of laser structures;
    ascertaining failure of the second plurality of laser structures based on their response to the plurality of short signal pulses; and
    comparing failures of the first and second plurality of laser structures to determine which of the first and second facet coatings caused their respective plurality of laser structures to be operated for a longer period of time without failure.

2. The method in accordance with claim 1, wherein the plurality of short signal pulses comprise a positive 2000 volt pulse and a negative 2000 volt pulse.

3. The method in accordance with claim 1, wherein ascertaining failure of the first and second plurality of lasers comprises:
    determining the amount of current that causes the first and second plurality of laser structures to become inoperable.

4. The method in accordance with claim 1, wherein ascertaining failure of the first and second plurality of lasers comprises:
    determining the Catastrophic Optical Damage (COD) threshold intensity for the first and second plurality of laser structures.

5. The method in accordance with claim 1, wherein the first and second plurality of laser structures are Fabry-Perot (FP) laser structures.

6. The method in accordance with claim 1, wherein the first and second plurality of laser structures are DFB laser structures.

7. The method in accordance with claim 6, wherein the first and second plurality of laser structures each comprise:
    a substrate;
    a mode modifier layer positioned above the substrate;
    a buffer layer positioned above the mode modifier layer;
    a first confinement layer positioned above the buffer layer;
    a second confinement layer positioned above the first confinement layer and below an active region;

a third confinement layer positioned above the active region;

a fourth confinement layer positioned above the third confinement layer;

a first spacer layer positioned above the fourth confinement layer;

an etch stop layer positioned above the first spacer layer;

a second spacer layer positioned above the etch stop layer;

a grating layer positioned above the second spacer layer; and a top layer positioned above the grating layer and below a mesa.

8. The method in accordance with claim 1, wherein the plurality of short signal pulses include an amplitude and a width that are the same.

9. The method in accordance with claim 1, wherein the plurality of short signal pulses include an amplitude that is varied and a width that is fixed.

10. The method in accordance with claim 1, wherein the plurality of short signal pulses include a width that is varied and an amplitude that is fixed.

11. The method in accordance with claim 1, wherein the plurality of short signal pulses include an amplitude and a width that are both varied.

12. The method in accordance with claim 1, wherein each pulse has a width less than or equal to about 2 milliseconds.

13. The method in accordance with claim 1, wherein the plurality of short signal pulses of current results in a larger amount of current to be applied to the first and second plurality of laser structures compared to a continuous wave.

14. The method in accordance with claim 13, wherein the plurality of short signal pulses of current results in less heat to be applied to the first and second plurality of laser structures compared to a continuous wave.

15. The method in accordance with claim 13, wherein the plurality of short signal pulses of current results in a larger amount of optical power output from the first and second plurality of laser structures compared to a continuous wave.

16. The method in accordance with claim 1, wherein the method is devoid of:

heating the first or second plurality of laser structures in an oven; and/or causing thermal roll-over.

\* \* \* \* \*